United States Patent
Mueller et al.

(10) Patent No.: US 7,597,756 B2
(45) Date of Patent: Oct. 6, 2009

(54) DEVICE AND METHOD FOR THE PRODUCTION OF MONOCRYSTALLINE OR MULTICRYSTALLINE MATERIALS, IN PARTICULAR MULTICRYSTALLINE SILICON

(75) Inventors: Matthias Mueller, Jena (DE); Markus Finkbeiner, Remchingen (DE); Uwe Sahr, Nuernberg (DE); Ingo Schwirtlich, Miltenberg (DE); Michael Clauss, Hofheim (DE)

(73) Assignee: Schott AG, Mainz (DE)

( * ) Notice: Subject to any disclaimer, the term of this patent is extended or adjusted under 35 U.S.C. 154(b) by 21 days.

(21) Appl. No.: 11/692,005

(22) Filed: Mar. 27, 2007

(65) Prior Publication Data
US 2007/0266931 A1 Nov. 22, 2007

(30) Foreign Application Priority Data
Apr. 12, 2006 (DE) .................... 10 2006 017 621

(51) Int. Cl.
*C30B 15/20* (2006.01)
(52) U.S. Cl. ................ 117/81; 117/83; 423/348
(58) Field of Classification Search ............ 117/81, 117/83, 221, 225; 111/222
See application file for complete search history.

(56) References Cited

U.S. PATENT DOCUMENTS

| 4,256,530 | A | 3/1981 | Schmid et al. |
| 6,464,198 | B1 | 10/2002 | Hugo |
| 6,712,904 | B1 | 3/2004 | Sonnenberg et al. |
| 6,969,502 | B2* | 11/2005 | Wehrhan et al. ......... 423/328.2 |
| 7,261,774 | B2* | 8/2007 | Muhe ......................... 117/81 |
| 2004/0079276 | A1 | 4/2004 | Muhe |

FOREIGN PATENT DOCUMENTS

| DE | 19855061 | * 11/1998 |
| DE | 198 55 061 | 5/2000 |
| DE | 102 39 104 | 4/2004 |
| EP | 0 218 088 | 4/1987 |
| EP | 0 631 832 | 1/1995 |
| EP | 0 996 516 | 5/2000 |
| EP | 1 072 696 | 1/2001 |
| EP | 1 147 248 | 10/2001 |
| JP | 05043385 | 2/1993 |
| JP | 2004299968 | 10/2004 |
| WO | 01/64975 | 9/2001 |

* cited by examiner

*Primary Examiner*—Felisa C Hiteshew
(74) *Attorney, Agent, or Firm*—Michael J. Striker

(57) ABSTRACT

The method of producing monocrystalline or multicrystalline blanks, especially silicon blanks, by using a vertical-gradient-freeze method, includes providing a crucible with a rectangular or square-shaped cross section and a heating jacket disposed around the crucible, which has a number of flat heating elements with a meandering course disposed on side faces of the crucible. The heating jacket generates an inhomogeneous temperature profile corresponding to a temperature gradient in the center of the crucible. The flat heating elements preferably comprise parallel heating webs, whose heat output is set by varying the conductor cross section. To avoid local overheating in corner areas of the crucible, constrictions of the cross section are provided at inversion zones of the meandering courses of the webs. The flat heating elements can be formed from a plurality of interconnected individual segments.

15 Claims, 6 Drawing Sheets

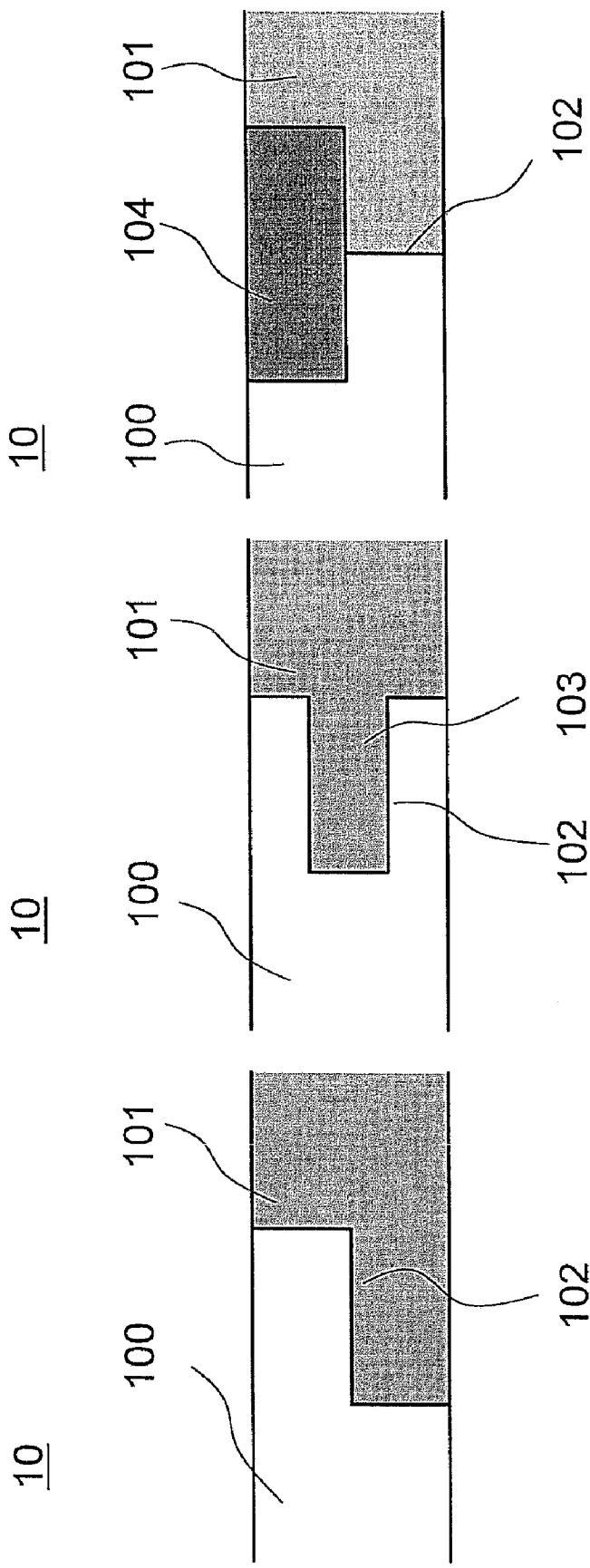

DEVICE AND METHOD FOR THE PRODUCTION OF MONOCRYSTALLINE OR MULTICRYSTALLINE MATERIALS, IN PARTICULAR MULTICRYSTALLINE SILICON

CROSS-REFERENCE

The present application claims the priority of German Patent Application No 10 2006 017 621.9-43, filed on 12 Apr. 2006, with the title "Method for the production of monocrystalline or multicrystalline materials, in particular multicrystalline silicon", the whole content of which is included herein by way of reference for purposes of disclosure.

FIELD OF THE INVENTION

The present invention relates generally to the production of comparatively large monocrystalline or multicrystalline material blanks using the vertical-gradient-freeze method (hereinafter also called the VGF method), in particular multicrystalline silicon for applications in photovoltaics, monocrystalline fluoride crystals and monocrystalline germanium crystals.

BACKGROUND OF THE INVENTION

Solar cells should have the highest possible degree of efficiency for the conversion of solar radiation power into electrical current. This is determined by a plurality of factors, such as, inter alia, the purity of the starting material, the penetration of impurities during crystallisation from the contact surfaces of the crystals with the crucible into the crystal interior, the penetration of oxygen and carbon from the surrounding atmosphere into the crystal interior and also by the growth direction of the individual crystal grains.

A common feature of all known production methods in which a large quantity of molten silicon is solidified to form an ingot is the fact that heat is withdrawn from the crystal melt from its base and hence a crystal grows from the bottom upward. Due to the typically high rate of solidification and the absence of a seed crystal, the crystal does not grow as a monocrystal but is multicrystalline. A block is formed comprising a plurality of crystal grains of which each grain grows in the direction of the locally prevailing temperature gradients.

Now, if the isotherms of the temperature field in the silicon melt are not planar and do not run parallel to the base of the crucible, i.e. horizontally, no planar phase interface forms and the individual grains do not grow parallel to each other and vertically from the bottom upward.

This is accompanied by the formation of linear crystal imperfections even within the monocrystalline regions. These undesired crystal imperfections can be made visible as etched pits by etching polished surfaces (e.g. on silicon wafers). A high number of linear crystal imperfections as described above therefore results in a higher etch density.

The minimisation of the density of etch pits, which may be influenced by a plurality of factors, inter alia the establishment of a planar phase interface has been a well-known requirement for a long time. The density of etch pits is therefore a measure of the success in the achievement of a pillar-type growth of the Si grains by means of a planar phase interface. Since the establishment of the HEM method (heat exchange method) as the first method suitable for mass production, attempts have been made to avoid the drawback of an almost punctiform heat sink on the base of the crucible (as is known, for example, from U.S. Pat. No. 4,256,530) and to achieve a vertical heat flow from the top downward in the molten silicon.

There are therefore a variety of solutions, which aim, as a first step, to create a heat sink that extends over the entire surface of the crucible base (see, for example, EP 0 631 832, EP 0 996 516, DE 198 55 061). The present invention is based on the assumption that a planar heat sink of this kind is provided.

To produce solar cells as inexpensively as possible, there is a further requirement for the entire silicon ingot to be available for further processing if at all possible. However, the production process is subject to restrictions. This is due on the one hand to the inward diffusion of impurities from the crucible wall into the silicon melt while on the other hand the segregation results in an accumulation of impurities on the upper side of the silicon ingot so that it is regularly necessary to remove edges of the silicon ingot. A further restriction is represented by the generally rectangular basic shape of solar cells. This makes it necessary to cut the silicon ingot to the desired cross section. In this regard, it is desirable for the amount of wastage to be kept as low as possible.

The production of multicrystalline silicon from a melt consumes much energy. Therefore, there is a further requirement for the capacity of the smelting furnace to be used to the optimum degree and to have effective thermal insulation. For reasons of space, the base area of the melting crucible should occupy as much as possible of the base area of the smelting furnace.

Due to the high economic importance of the production of silicon as a starting material for the production of semiconductors and semi-conductor components, a plurality of different approaches for growing silicon monocrystals or multicrystalline silicon are known from the prior art. For example, U.S. Pat. No. 4,256,530 discloses a method for growing a silicon monocrystal using a melting crucible with two-layer walls so that the silicon melt does not come into direct contact with graphite or elemental carbon that would otherwise diffuse rapidly into the silicon melt.

To obtain the lowest possible dislocation density in the crystal, during the crystal growth, care should be taken to ensure that the phase interface between solid and liquid is as planar as possible and runs transverse to the direction of crystallisation. This objective requires the radial heat radiation to be kept as low as possible. According to WO 01/64975 A2, to form a planar phase interface between the base of a melting vessel and its upper opening, a vertically extending axial temperature gradient is applied and measures are taken to avoid heat dissipation through the side walls of the melting vessel. To this end, all heating elements are enclosed in a jacket of insulating material surrounding the melting vessel as a way of preventing an undesirable and uncontrolled heat flow. To this end, a jacket of insulating material is disposed between the jacket heater and the crucible as an additional way of preventing a radial heat flow. This achieves a dominance of the axial temperature profile created by the upper heater and bottom heater.

EP 1 147 248 B1 discloses a device for producing a monocrystal by growing the monocrystal from a melt, wherein the furnace has a rotationally symmetrical design and wherein a wedge-shaped thermal insulation is provided around the melting vessel, viewed in the longitudinal direction of the vessel, with an insulating effect decreasing going from the upper heater to the bottom heater. As a result, heat losses close to the bottom heater are greater than those close to the cover heater. This supports a temperature gradient in the longitudinal direction of the melting vessel that is determined by different temperatures of the upper heater and bottom heater. The thermal insulation also significantly restricts the heat flow in the radial direction of the melting vessel resulting in the formation of planar phase interfaces.

DE 102 39 104 A1, corresponding to US 2004/0079276 A1, discloses a crystal growing furnace for a VGF method or vertical Bridgman method. Two jacket heaters or flat, planar heating devices are disposed around the melting vessel coaxially and vertically one above the other. In addition, measuring devices are provided to determine radial temperature differences in the space between the jacket heaters and the melting vessel. A regulator sets the heat output of the jacket heaters in such a way that the temperature difference measured in the radial direction becomes zero. In this way, planar phase interfaces are established resulting in the production of high-quality, low-dislocation silicon monocrystals.

According to the prior art, the heaters and the external contour of a crystallisation system for multicrystalline silicon are usually rotationally symmetrical, i.e. they have a circular profile. Since the usual square-shaped crucible is surrounded by this circular heater, the problem of corner overheating occurs. This results in thermal stresses causing flaking in the corners and consequently a comparatively large amount of wastage, which it is desirable to avoid. Typically, with the production of large fluoride monocrystals and of germanium crystals, round crystals are produced in round crucibles. The crucibles are surrounded by round heaters that display no differences between the upper and lower regions as far as thermal radiation is concerned.

SUMMARY OF THE INVENTION

Therefore, it is an object of the present invention to provide a device and a method for the inexpensive production of high-quality, low-dislocation monocrystalline or multicrystalline material blanks using the VGF method, in particular multicrystalline silicon, large fluoride monocrystals or germanium monocrystals.

This object and other objects are achieved according to the present invention by a device with the features according to claim 1 and by a method with the features according to claim 16. Other advantageous embodiments are the subject matter of the related dependent claims.

Accordingly, the present invention relates to a device with a fixed crucible and a heating device for melting the silicon in the crucible. The heating device and/or any thermal insulation for the device are hereby so designed to create a temperature gradient in the longitudinal direction in the crucible. This is normally achieved by keeping the base or bottom of the crucible at a lower temperature than its upper end. In addition, with a device of this kind, the heating device is a flat or planar heating element (hereinafter referred to as a "jacket heater") to suppress a heat flow perpendicular to the longitudinal direction, i.e. directed horizontally outward.

According to the invention, the jacket heater or flat, planar heater is a single-zone heater, which is configured such that its heat output decreases in the longitudinal direction going from the top end to the bottom end in order at least to contribute to the maintenance of the temperature gradient formed in the crucible. In other words, by varying the heat output of the jacket heater in the longitudinal direction of the crucible in a continuous or discrete way, the formation of a predetermined temperature gradient in the crucible is at least assisted. This temperature gradient is established in the melting crucible by different temperatures of an upper heater and a bottom heater in a way that is known per se. In this regard, the temperature of the bottom heater on the base or bottom of the melting crucible is lower, in particular below the melting temperature of the silicon to be processed. Hereby, expediently, the bottom heater does not necessarily extend over the entire base area of the crucible. Although the formation of a planar phase interface in the material to be crystallised, for example silicon, can be realised most precisely with a bottom heater extending over the base area of the crucible, a planar phase interface sufficient for practical applications can also be achieved by disposing a crucible mounting plate between the heater and the crucible permitting the disposal of a smaller-area bottom heater combined with a cooling device. According to the invention, the temperature gradient between the top and bottom is now reproduced by the heat output of the jacket heater which varies in the longitudinal direction of the melting crucible so that over the entire cross section of the crucible, in particular also in the region of the corners of the polygonal crucible, a planar phase interface forms between the already crystallised silicon and the still molten silicon, that is, a horizontally extending phase interface. Therefore, according to the invention, no expenditure is required for thermal insulation between the crucible and the jacket heater because the graphite crucible surrounding the quartz crucible is sufficient to homogenise the temperature profile generated by the jacket heater. In this regard, sufficient homogenisation means in particular that, as a result of the high thermal conductivity of the external crucible material, graphite, local differences relating to the heat radiated by the jacket heater are equalised. The vertical temperature profile formed in this way in the graphite crucible wall is transferred by the crucible wall of the poorly heat-transferring quartz crucible through to the internal wall of the quartz crucible virtually unchanged. At the contact surface between the molten silicon and the quartz crucible, the temperature decreases monotonously and approximately linearly from the top downward. As a result, despite the omission of the layer of thermal insulation material, it is possible to ensure a planar, horizontal phase interface between the crystallised silicon and the still molten silicon. With the same external dimensions of the crystallisation system, this facilitates an overall larger crucible cross section and hence, according to the invention, the provision of larger silicon ingots resulting in significant cost advantages. The single-zone jacket heater according to the invention with a defined adjustable temperature profile over the jacket height is particularly advantageous with the production of multicrystalline silicon if quartz crucibles with a height of more than approximately 250 mm, in particular more than approximately 300 mm and quite particularly preferably more than 350 mm are used. The single-zone jacket heater with a defined adjustable temperature profile over the jacket height is of particular advantage during the production of fluoride monocrystals and germanium monocrystals if crystals with a height of more than approximately 200 mm are produced.

According to the invention, the heat output of the jacket heater can be suitably adjusted by simple measures, such as, for example, the variation of the geometric cross section of the jacket heater. In particular, in this way, the jacket heater can be simply matched to the geometry-induced thermal properties of the crucible.

Preferably, the crucible has a polygonal cross section, quite particularly preferably, a rectangular or square-shaped cross section, so that polygonal, in particular rectangular or square-shaped elements, preferably, silicon elements, can be cut out of the silicon ingot with an advantageously low amount of wastage. The device according to the invention is therefore based on a departure from the conventional concept of using a rotationally symmetrical melting crucible for the production of multicrystalline silicon. Unlike the prior art, the heater disposed around the crucible has the same contour as the crucible. For example, a square-shaped crucible is therefore surrounded by a square-shaped heater. The conventional thermal insulation layer between heater and crucible is omitted.

According to a further embodiment, the heat output of the single-zone jacket heater decreases in the longitudinal direction of the crucible going from the top to the bottom in correspondence with the temperature gradient in the centre of the crucible. In particular, the heat output of the jacket heater decreases per length unit in exactly the same ratio at which the temperature gradient in the centre of the crucible decreases. According to the invention, this exact, in particular proportional, reproduction of the temperature gradient in the centre of the crucible over the entire circumference of the latter is a simple way of ensuring planar phase interfaces between already crystallised silicon and still molten silicon over the entire cross section of the crucible, in particular also in corner regions of the crucible.

According to a further embodiment, the jacket heater sets or maintains a plurality of planar isotherms vertically to the longitudinal direction of the crucible. The resulting planar phase interface over the entire cross section of the crucible results in an advantageous reduction of crystal imperfections and hence to an advantageously low density of etch pits of silicon wafers produced according to the invention.

According to a further embodiment, the distance between the crucible wall and a plane spanned by the jacket heater over the entire circumference of the crucible is constant. This measure enables the avoidance of local overheating of regions of the crucible wall that would otherwise result in the distortion of the phase interface. In particular, in this way, the jacket heater can be disposed uniformly over the entire circumference of the crucible. According to this embodiment, the jacket heater also comprises a polygonal cross section, in particular according to a preferred embodiment a rectangular or square-shaped cross section, which deviates significantly from the conventional rotationally symmetrical configuration according to the prior art.

In particular in the case of crucibles with rectangular or square-shaped cross sections, increased heat losses have been observed due to a larger radiating surface per unit volume. Increased thermal radiation losses of this kind also occur in a milder form with polygonal crucibles with cross sections that are not rectangular or square-shaped. To compensate for unwanted increased losses of this kind, the heat output of the jacket heater is higher in corner areas of the crucible or alternatively a distance between the crucible wall and the jacket heater in the corner areas of the crucible may be selected smaller. In this regard, the heat output of the jacket heater can be increased continuously or in one or more discrete steps in the corner areas. Alternatively, the distance between the crucible wall and the jacket heater can be reduced continuously or in one or a plurality of discrete steps. In particular, the jacket heater can be embodied as continuously curved in the corner areas, with a minimum distance on an imaginary extension of a line extending from the centre of the crucible to the respective corner of the crucible, wherein this minimum distance is less than it is in the regions of the crucible wall outside the respective corner region.

According to a further embodiment, in particular in the case of crucibles with rectangular or square-shaped cross sections, the jacket heater comprises heating elements disposed around the side faces of the crucible which have a meandering course in the longitudinal direction of the crucible or perpendicular thereto. In this way, a comparatively uniform heat impingement on the crucible wall is achieved and the electronic layout of the jacket heater can nevertheless be varied in a simple way in correspondence with the temperature gradient in the melting crucible. In this regard, a gap width between the webs of the meandering course of the jacket heater is expediently selected so that the efficiently heat-conducting graphite crucible wall itself leads to sufficient smoothing of the temperature profile. The gap width between webs of the jacket heater therefore also depends in particular on the thermal conductivity of the material or materials of the inner crucible, for example the quartz crucible, and on the outer support crucible, for example the graphite crucible. Expediently, the gap width is in this regard selected in such a way that any inhomogeneity of the temperature profile on the wall of the crucible induced thereby is less than a predetermined temperature deviation, which is preferably less than for example 5 K, more preferably less than for example 2K and still more preferably less than for example 1 K.

According to a first embodiment, the heating elements are configured as rectangular webs extending perpendicular to the longitudinal direction, which in the longitudinal direction of the crucible have a meandering course and whose conductor cross sections decrease from the top end to the bottom end of the crucible in several discrete steps. A jacket heater disposed in this way can be formed by the simple connection of preshaped individual parts made of graphite or by casting a suitable heat conducting material in a suitable geometric configuration.

Expediently in this regard, the webs of the jacket heater extend with a meandering course equidistantly and parallel to each other. The webs extending horizontal or vertically to the longitudinal direction thereby define isotherms which extend over the entire circumference of the crucible at the same height level and hence lead automatically to the formation of planar, horizontal phase interfaces in the crucible. The direction of the course of the webs is in this regard inverted in inversion zones lying opposite to the corner areas of the crucible. The geometry of the inversion zones, in particular their conductor cross sections, therefore provides a simple parameter for selectively specifying the thermal conditions in the corner areas of the crucible.

In particular, in the case of crucibles with rectangular or square-shaped cross sections, the jacket heater comprises heating elements disposed around the side faces of the crucible which have a meandering course in the longitudinal direction of the crucible or vertically thereto. In this way, a comparatively uniform heat impingement on the crucible wall is achieved and the electronic layout of the jacket heater can nevertheless be varied in a simple way in correspondence with the temperature gradient in the melting crucible. In this regard, a gap width between the webs of the meandering course of the jacket heater is expediently selected so that the efficiently heat-conducting graphite crucible wall itself leads to sufficient smoothing of the temperature profile. The gap width between webs of the jacket heater is therefore also determined in particular by the thermal conductivity of the material or materials of the inner crucible, (e.g. quartz crucible), and the outer support crucible (e.g. graphite crucible). Expediently, the gap width is hereby selected in such a way that any inhomogeneity of the temperature profile on the wall of the crucible induced thereby is less than a predetermined temperature deviation, which is preferably less than for example 5 K, more preferably less than for example 2K and still more preferably less than for example 1 K.

In particular, in the case of crucibles with rectangular or square-shaped cross sections, special measures may be provided in the region of the corners in order to guarantee the desired horizontal isotherms there as well. In the region of the diagonals in the inversion zones, without further measures to reduce the conductor cross section, simple inversions in the form of vertical heating webs in the case of otherwise horizontally meandering heating webs can result in a locally increased conductor cross section and hence in reduced heat output with the consequence of a lower surface temperature on the heater. This means that an isothermal behaviour along the longitudinal coordinate of the crucible could no longer be guaranteed. There would then be an unwanted decrease in temperature at the corners with negative impacts (stresses in the corners, high defect density and microcracks induced thereby resulting in yield losses). According to the invention, there is a variety of possible measures to compensate such deviations from the desired conductive equilibrium (isothermal behaviour) along the longitudinal coordinate. The distance between the crucible wall and the jacket heater in the corner areas of the crucible can be reduced continuously or in several steps since the requirement for conductive equilibrium in principle only exists in the crystallisation phase. In particular, the jacket heater can be configured as continuously curved in the corner areas, with a minimum distance on an imaginary extension of a line from the centre of the crucible to the respective corner of the crucible, wherein this minimum distance is less than it is in the regions of the crucible wall outside the relevant corner region According to a preferred further embodiment, a conductor cross section of webs at the inversion zones of the meandering course is constricted in the diagonal direction in such a way that it is equal to the conductor cross section of the web before or after the respective inversion zone. This results in the maintenance of the electrical resistance and hence in the same heat output or surface temperature in the inversion zone of the webs as in the region of the horizontally extending webs.

According to a further embodiment, the constrictions of the conductor cross section at the inversion zones is achieved in a controlled manner by a plurality of perforations or recesses in or out of the web material, which are disposed in a transverse distribution relative to the conductor cross section. In this way, the geometry and the dimensions of the perforations or recesses enable the conductor cross section or the electrical resistance in the inversion zones to match that of the webs. The direction of the course of the perforations or recesses in this regard represent variants which can all lead to the homogenisation of the horizontal temperature distribution over the circumference of the crucible in each height coordinate. With an overall rectangular course of the webs, the perforations or recesses can extend in particular along one of the diagonals connecting the corner regions of the webs. Overall, it is expedient for the plurality of perforations or recesses to extend mirror-symmetrically or almost mirror-symmetrically about an imaginary mirror axis in the centre of the gap between two adjacent webs.

According to a second embodiment of the present invention, the heating elements are disposed as rectangular webs extending in the longitudinal direction whose conductor cross section increases continuously or in a plurality of discrete steps going from the top end to the bottom end of the crucible. In this regard, all the webs extending in the longitudinal direction or perpendicular thereto are embodied the same so that, viewed in the longitudinal direction of the crucible, a plurality of planar, horizontal isotherms or isothermal lines are defined in a quasi continuous or discrete way by the jacket heater. In this regard, as described above, the gap width between the webs is selected so that the efficiently heat-conducting material of the crucible ensures sufficient homogenisation of the temperature profile between the webs of the jacket heater. In each case, the regions between the webs do not result in deviations from the monotonous and almost linear temperature rise in the increasing longitudinal coordinate of the crucible, wherein here locations where the material to be crystallised comes into contact with the inner crucible wall are respectively considered.

According to a further embodiment, the jacket heater is made from individual segments, which can be optionally, for example in the case of local damage or if the jacket heater is to be disposed differently, removed and replaced by another segment. A modular design of this kind has in particular proved its value for jacket heaters comprising a plurality of heating webs with a meandering course. In this regard, the segments must be connected in such a way that an unimpeded current flow is ensured at the connecting points or junctures, which necessitates certain compromises with the choice of the type of connection and the materials. In particular, the segments may be connected detachably to each other by means of connecting elements, such as for example wedges or stoppers or pins with an identical or slightly higher coefficient of thermal expansion or by means of other positive-locking, friction-locking or non-positive-locking elements, in particular screws or rivets. According to another embodiment, the segments can also be connected firmly bonded to each other, for example by soldering or welding.

According to a further preferred embodiment, no further thermal insulation is provided between the crucible wall and the jacket heater. It is advantageous with the same cross section of the jacket heater for it to be possible to pull the crucible wall closer to the jacket heater thus making it possible to produce silicon ingots with a larger cross section with the same crystallisation system base.

As explained above, a further aspect of the present invention relates to a method for the production of multicrystalline silicon using the vertical-gradient-freeze method (VGF method) using a single-zone jacket heater by means of which the temperature distribution in the crucible is set so that the isotherms of the melting temperature of the silicon to be grown intersect the melting crucible horizontally. Hereby, slow cooling of the entire furnace in conjunction with a displacement of the vertical temperature profile upward achieves oriented solidification of the silicon with the direction of the course of the crystalline regions in the vertical direction.

To minimise crystal imperfections, care must be taken in this regard to ensure that ideally no radial heat flow occurs. While this is conventionally achieved by providing the most ideal possible thermal insulation surrounding the jacket surface of the crucible, in order to prevent radial heat flow, according to the invention the temperature gradient in the crucible is simulated by the jacket heater disposed around the circumference of the crucible. According to the invention, therefore, only reduced efforts are required for the thermal insulation of the system components comprised of the crucible and heater against the outer wall of the crystallisation system and hence against the environment which results in rapid heat transfer due to the narrow coupling. The possibilities for controlling the process are, therefore, greatly improved due to the lower time delays.

A further aspect of the present invention relates to the use of a crystallisation system as described above or a corresponding crystallisation method for the production of multi-crystalline silicon by means of a vertical-gradient-freeze crystal growth method (VGF), in particular as a starting material for multicrystalline Si wafers for use in photovoltaics.

BRIEF DESCRIPTION OF THE DRAWINGS

The invention will now be described by way of example with reference to the attached drawings from which further features, advantages and objects to be achieved will be seen. These show:

FIG. 4a-4c in a schematic overview, different types of connecting means for connecting webs of the jacket heater according to FIG. 2;

In the drawings, the same reference numbers indicate elements or groups of elements which are identical or which perform a substantially equivalent technical function.

DETAILED DESCRIPTION OF THE PREFERRED EXEMPLARY EMBODIMENTS

Figure 1:
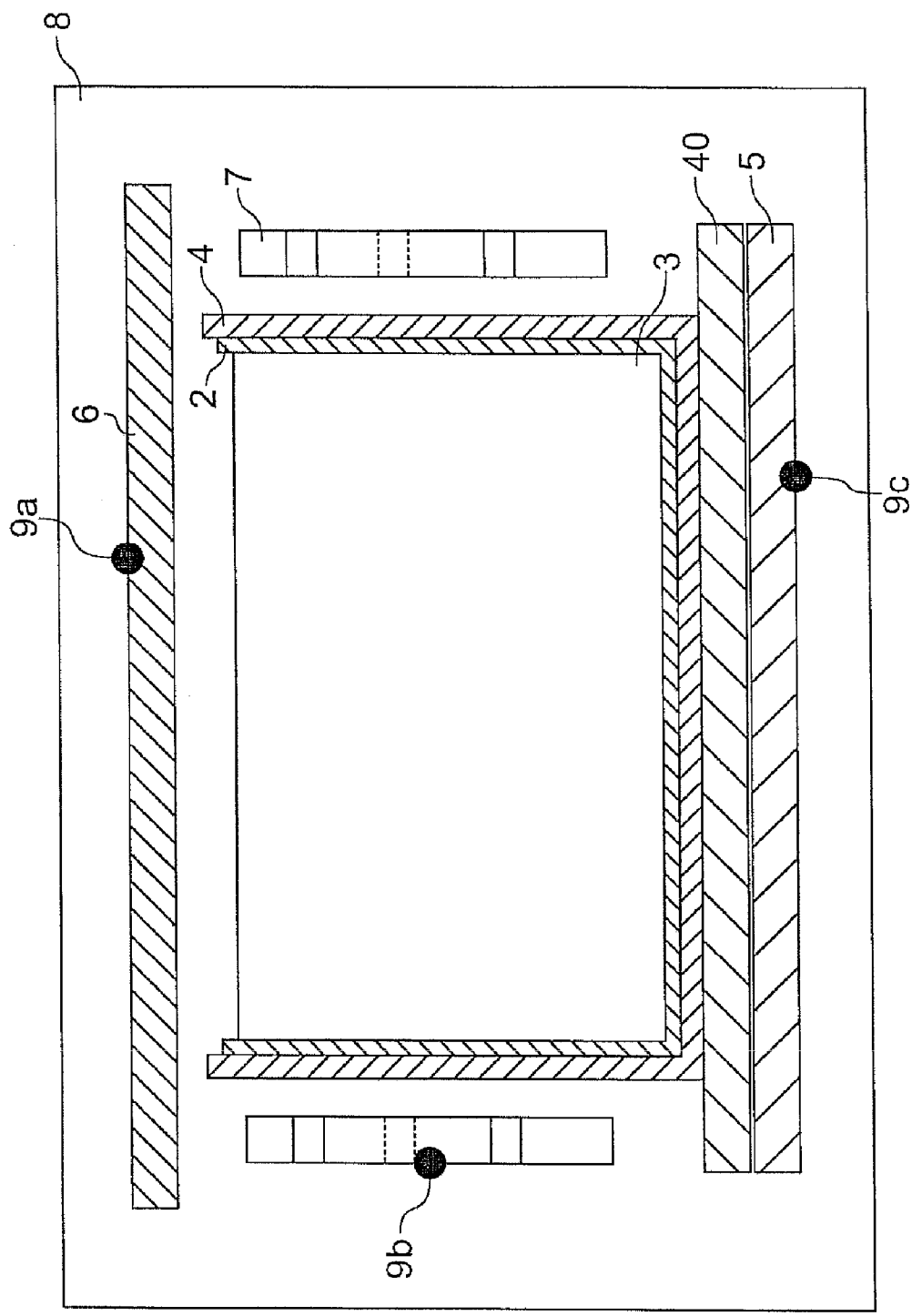
FIG. 1 in a schematic cross-sectional view, a device for the production of multicrystalline silicon according to the present invention.

FIG. 1 shows an example of a vertical-gradient-freeze crystallisation system comprising a crucible with a quadrangular cross section. According to FIG. 1, the crucible is formed from a quartz crucible 2, which, for support, is accommodated as a tight fit in a correspondingly shaped graphite container 4. Therefore, the silicon 3 accommodated in the crucible 2 does not come into contact with the graphite container 4. The crucible is disposed standing upright so that the crucible walls extend along the direction of gravity. Above and below the crucible, there is an upper heater 6 or a bottom heater 5, respectively, wherein disposed between the crucible and the bottom heater 5 there is a crucible mounting plate 40, made for example from graphite, which in the drawing is only schematically indicated. In this regard, the actual holder for the aforementioned crucible is disposed so that a narrow gap is formed between the bottom heater 5 and the crucible mounting plate 40 supporting the crucible. The core zone of the crucible is surrounded by a jacket heater 7, i.e. a planar, flat heating device, which will be described in more detail below. With the VGF crystallisation method, all the heaters 5-7 are temperature-controlled. For this, the surface temperatures of the heaters are determined by pyrometers 9a-9c at a suitable point, as shown by way of example in FIG. 1, and entered into a control unit, which controls or regulates the constant current flowing through the heaters 5-7.

To crystallise out the silicon melt, the bottom heater 5 and the upper heater 6 are regulated in such a way that the upper heater 6 is kept at a temperature above the melting temperature of the silicon to be processed and the bottom heater 5 is first brought to a temperature just below the melting temperature of the silicon to be processed. This first results in crystallisation on the bottom of the crucible. Since the bottom heater 5 extends over the entire area of the bottom of the crucible, the silicon crystallises in not only the centre but on the entire bottom of the crucible in the form of a plurality of crystallites. Then, the temperature of each of the three heaters shown is reduced in parallel with that of the other heaters so that the melt in the crucible can solidify continuously upward, wherein the phase interface between the already crystallised and the still molten material extends horizontally, i.e. perpendicular to the direction of gravity.

According to FIG. 1, no further thermal insulation is provided between the crucible wall 2, 4 and the jacket heater 7. Instead, as will be described in more detail below, according to the invention, a suitable geometric configuration of the jacket heater 7 ensures that the temperature gradient established by the upper heater 6 and the bottom heater 5 in the crucible is supported or maintained by the heat output from the jacket heater. To this end, the heat output from jacket heater is not locally constant but decreases in the longitudinal direction of the crucible going from the top end to the bottom end and namely in correspondence with the temperature gradient in the centre of the crucible during the gradual solidification of the silicon melt.

Figure 2:
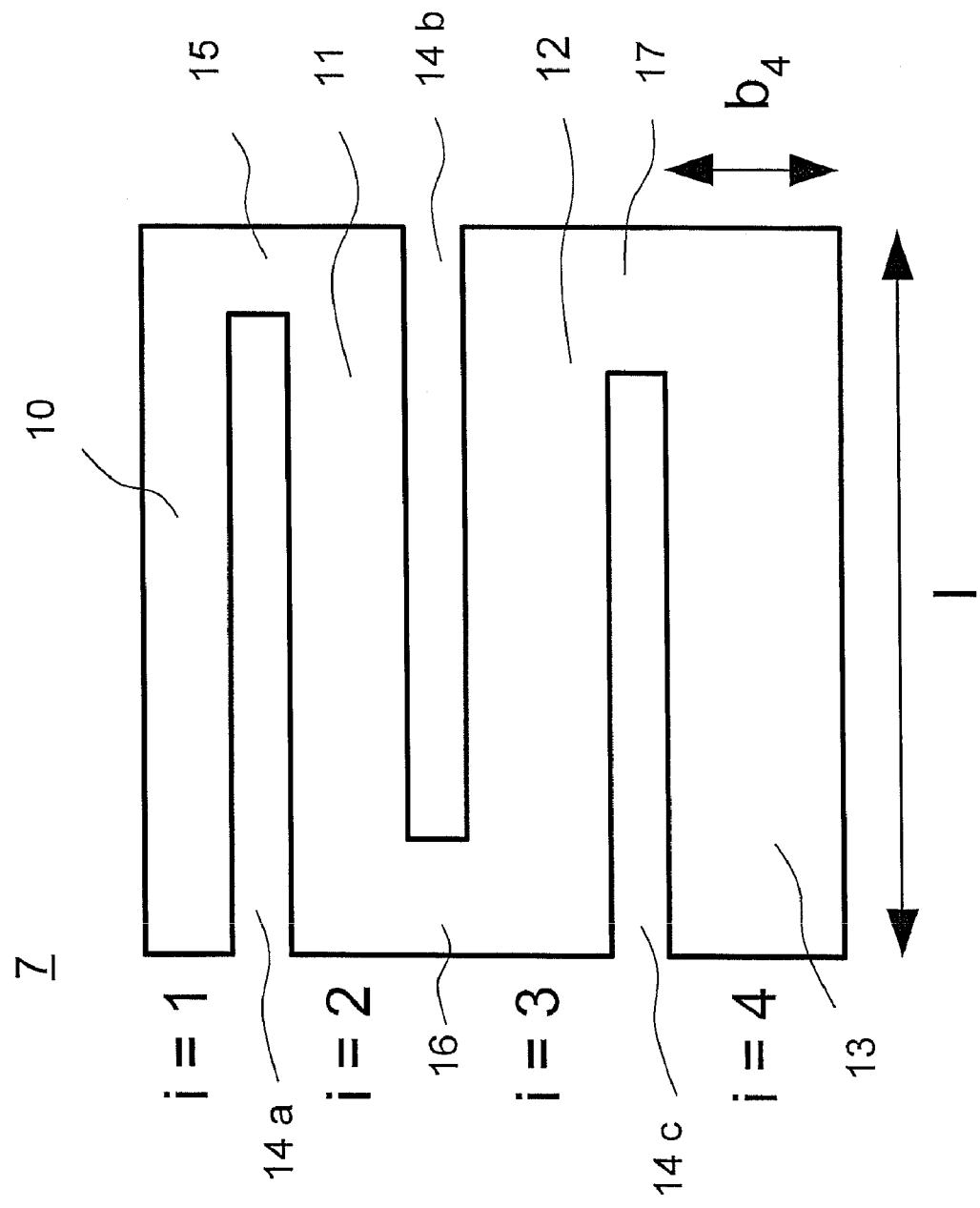
FIG. 2 in a schematic overview, a jacket heater with a meandering course of the heating webs.

FIG. 2 shows a jacket heater segment according to a first embodiment of the present invention comprising a plurality of heating webs with a rectangular profile, which form a meandering course in the longitudinal direction of the crucible. To be more precise, each jacket heater segment according to FIG. 2 is disposed at a constant distance to a crucible wall in such a way that the webs 10-13 extend exactly horizontally, perpendicular to the longitudinal direction of the crucible. The course direction of the webs 10-13 is inverted at the inversion zones 15-17. According to FIG. 2, the cross section of webs 10-13 increases going from the top end to the bottom end of the crucible in discrete steps. The heat output of the uppermost web 10 is hence the greatest and decreases in discrete steps, as determined by the conductor cross sections of the webs 11, 12, to the lowest heat output determined by the cross section of the bottommost web 13.

In an alternative embodiment (not shown), the widths of the webs 10-13 are constant, but their thickness increases, viewed perpendicular to the plane of projection in FIG. 2, in discrete steps going from the top end to the bottom end of the crucible.

A constant current flows through a jacket heater comprising a plurality of jacket heater segments. In this regard, the horizontally extending webs 10, 11, 12 and 13 define isotherms (isothermal planes), which extend over the entire width of the crucible. A plurality of such jacket heaters according to FIG. 2 are disposed around the circumference of the crucible with the same spacing in each case so that the isotherms set by the webs 10-13 extend over the entire cross section of the crucible in order in this way to establish planar, horizontal isothermal surfaces.

Even though in FIG. 2, the jacket heater 7 has four transverse webs overall, according to the invention any other numbers of heating webs can be used. The optimum number of heating webs is determined by the desired homogenisation of the temperature profile in the crucible and on the crucible wall. The embodiment of the jacket heater is in this regard determined in particular by the width of the gap 14a-14c between the webs 10-13, the selected distance between the jacket heater 7 and the crucible wall and the thermal properties of the crucible wall. The efficiently heat-conducting graphite crucible 4 (see FIG. 1) with an adequate thickness and the quartz crucible located therein lead in this regard to a certain smoothing of the vertical temperature profile. The above parameters are selected so that the position of one web of the jacket heater on the temperature profile at the interface between the silicon and lateral internal wall of the quartz crucible can substantially no longer be determined.

Generally, with the jacket heater according to FIG. 2 with a length of webs 1, a width of the webs $b_i$ (wherein i designates the running index for the web) and a thickness d (vertical to the plane of projection in FIG. 2), the electrical resistance of a heating web with the index i is described by:

$R_i \sim 1/A_i$, wherein $A_i = b_i \times d$.

Then, the following applies to the cross-sectional area:

$A1 < A2 < A3 < A4$.

From this, the following applies to the resistances of the individual meanders:

$R1 < R2 < R3 < R4$.

Consequently:

$T1 > T2 > T3 > T4$.

Therefore, in the vertical direction, a temperature profile is obtained with a temperature increasing in discrete steps upward. When a constant current intensity flows through the heating meander, a lower temperature is generated in the webs with a large cross section (corresponding to a low electrical resistance) than in the webs with a small cross section (corresponding to a high electrical resistance).

As is easily evident to a person skilled in the art, the variation of the conductor cross section through which current flows from web to web can also be achieved by varying the web thickness d instead of the web width b, as described above.

In an exemplary embodiment, according to FIG. 2 the following area ratios are established.

| A1/A1 | 1 |
|---|---|
| A2/A1 | 1.055 |
| A3/A1 | 1.11 |
| A4/A1 | 1.165 |

These area ratios produce the following resistance ratios:

| R1/R1 | 1 |
|---|---|
| R2/R1 | 0.948 |
| R3/R1 | 0.901 |
| R4/R1 | 0.858 |

As is evident from FIG. 2, the width of the heating conductor also varies in the inversion zones 15 to 17 in a corresponding way. The width of the inversion zone 15 is hence less than the width of the inversion zone 16, which is in turn less than the width of the inversion zone 17. The variation of the widths of the inversion zones follows the temperature profile to be formed.

If one considers the inversion zones 15-17 of the jacket heater 7 according to FIG. 2, local cross section enlargements occur in the material through which current flows. Without countermeasures, these would result in a low temperature at the corner areas of the crucible. According to the invention, this is counteracted by the selective constriction of the conductor cross section in the inversion zones. In particular, such a constriction of the conductor cross section can also compensate increased heat losses in the corner areas of the crucible, for example due to higher thermal radiation losses caused by the larger radiating area per unit of volume.

Figure 3C:
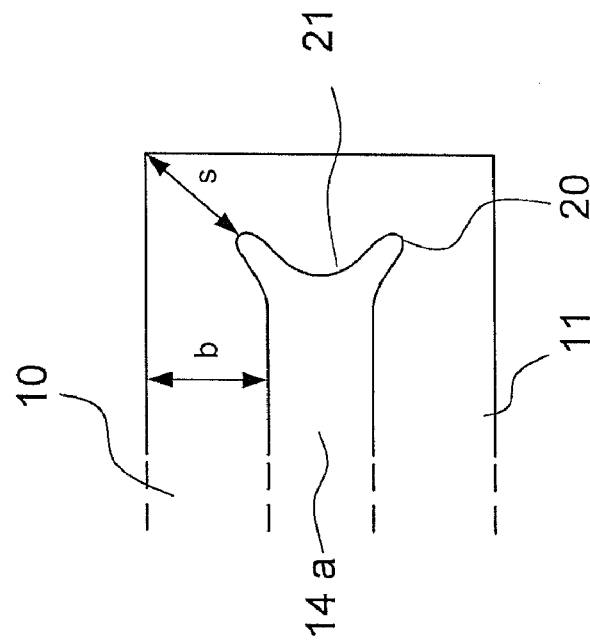
FIG. 3c measures for constriction of the conductor cross section according to a third embodiment of the present invention.
Figure 3B:
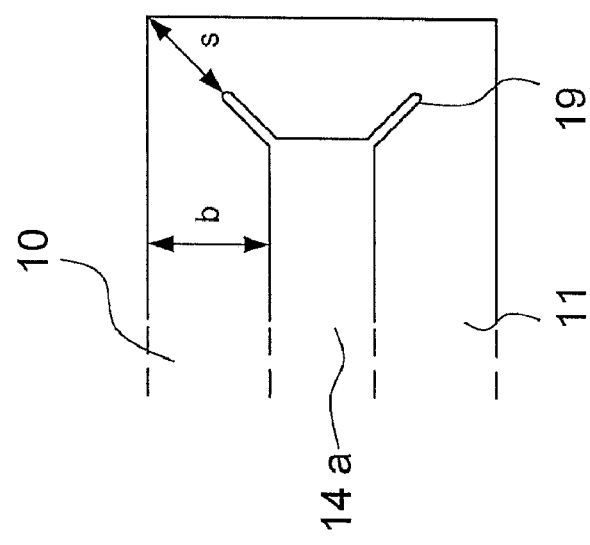
FIG. 3b measures for constriction of the conductor cross section according to a second embodiment of the present invention.
Figure 3A:
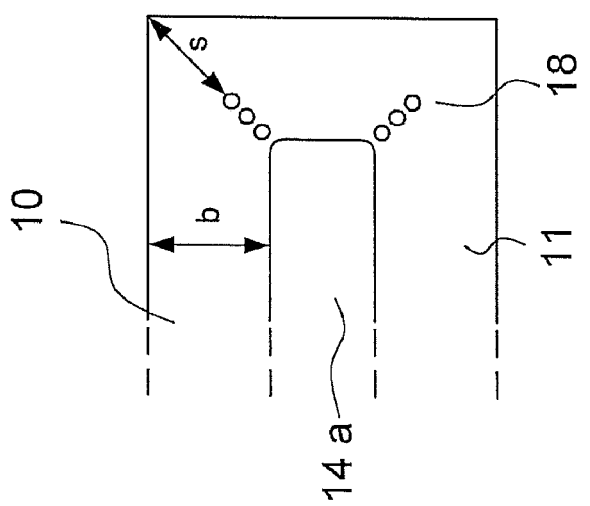
FIG. 3a in a schematic representation, measures for constriction of the conductor cross section according to a first embodiment of the present invention.

According to FIG. 3a, a plurality of perforations or recesses 18 is disposed along the diagonals of the respective inversion zone and to be precise aligned on the diagonals. Overall, the perforations or recesses 18 are disposed mirror-symmetrically to the centre line of the gap 14a. Obviously, it is also possible to provide a plurality of such rows of perforations or recesses. The disposal and choice of the number of perforations or recesses can be used to establish the suitable resistance ratio between the web 10, 11 extending in a horizontal direction and the associated inversion zone.

With the embodiment according to FIG. 3b, rectangular recesses are disposed along the diagonals. The choice of the ratio s/b can be used to establish an optimum resistance ratio.

According to FIG. 3c, constriction recesses are disposed along the diagonals wherein, disposed between the recesses 20, there is a concave inwardly curved course of the edge. The above recesses 11, 20 can in particular be formed by milling from the material of the heating conductor.

Preferably, the webs of the jacket heater are made of graphite. Since according to the invention, crucibles with a base of 680×680 mm or even larger crucibles are used and correspondingly large graphite blocks for the production of webs of the jacket heater are either not available at all or are only available at a comparatively high price, according to a further embodiment, the webs of the jacket heater segments are formed, as described below with reference to FIG. 4a to 4d, once again from a plurality of smaller segments. In this regard, care must be taken to ensure that the current flow through the junctures between the jacket heater segments and between the smaller segments is as unimpeded as possible. For this, positive-locking engaging junctures with rectangular geometry are used.

According to FIG. 4a, the ends of the heating segments 100, 101 are substantially L-shaped so that a graduated interface 102 is formed between the two segments 100, 101. According to FIG. 4b, a central U-shaped recess is disposed at the end of the segment 100 and disposed at the opposite end of the segment 101 is an inversely U-shaped projection 103, which fits tightly into the recess of the segment 100. As a result, an interface 102 with a central projection forms between the segments 100, 101. According to FIG. 4c, disposed at the ends of segments 100, 101, there is a rectangular recess to accommodate a connecting element 104.

Figure 4D:
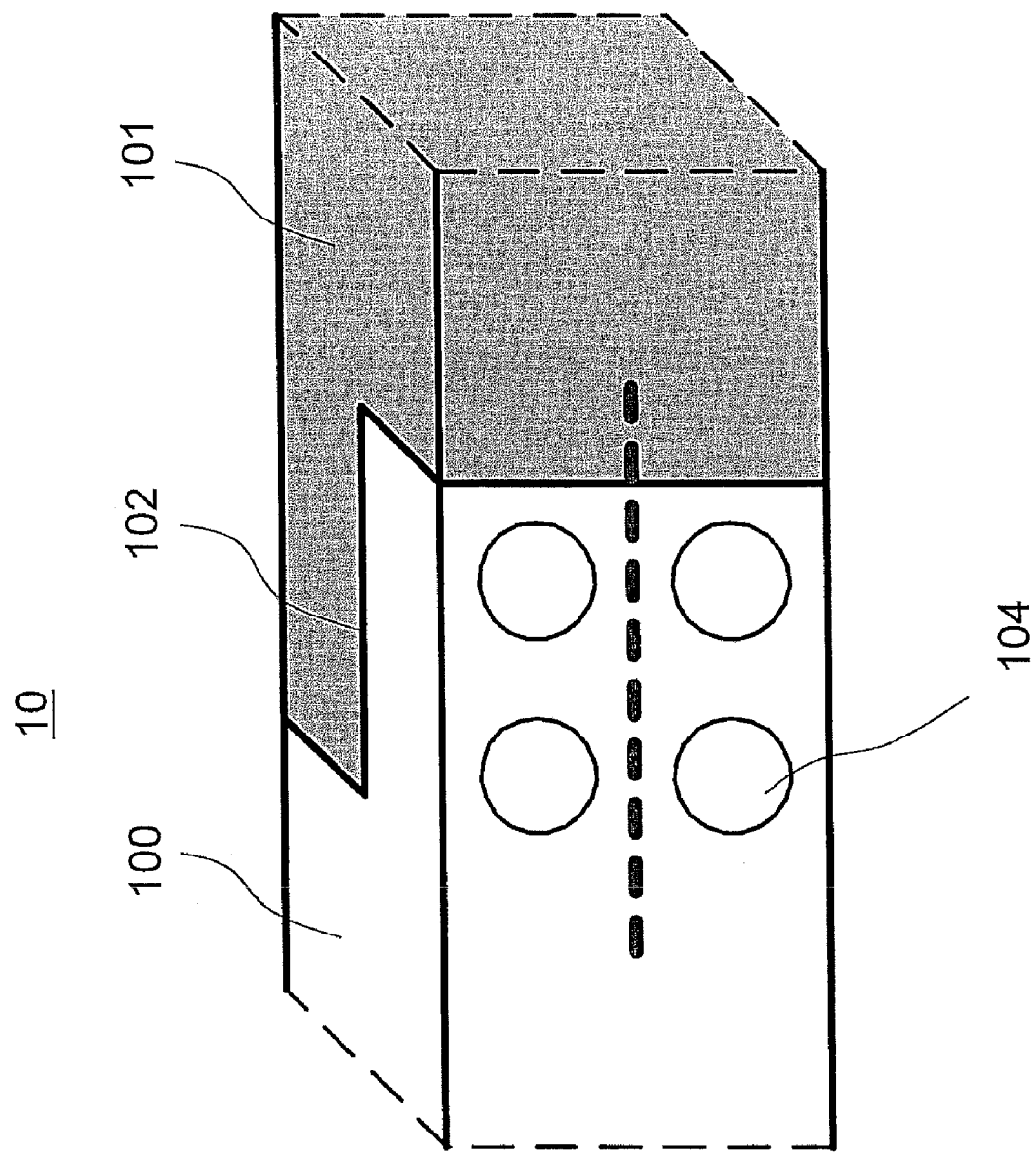
FIG. 4d in a perspective view, a further type of connection.

FIG. 4d shows the connection according to FIG. 4a in a perspective overview, wherein the segments 100, 101 are penetrated by cylindrical connecting elements 104. The connecting elements 104 can be made of the material used for segments 100, 101. The engagement of the connecting elements 104 in the segments 100, 101 can be positive-locking, friction-locking or non-positive locking. The connecting elements 104 can alternatively also be made of another material with an identical or slightly higher coefficient of thermal expansion than the material used for segments 100, 101.

Exemplary Embodiment 1

Two rectangular heater segments made of graphite are connected together in the manner according to FIG. 4d and a temperature profile was measures along the dotted line according to FIG. 4d with local resolution. For reasons of corrosion, the measurements were taken in a normal air atmosphere and at a lower temperature than the subsequent operating temperature under current throughput. The measured homogeneity of the temperature profile at this low temperature level is, however completely transferable to the subsequent higher operating temperature level.

Figure 5:
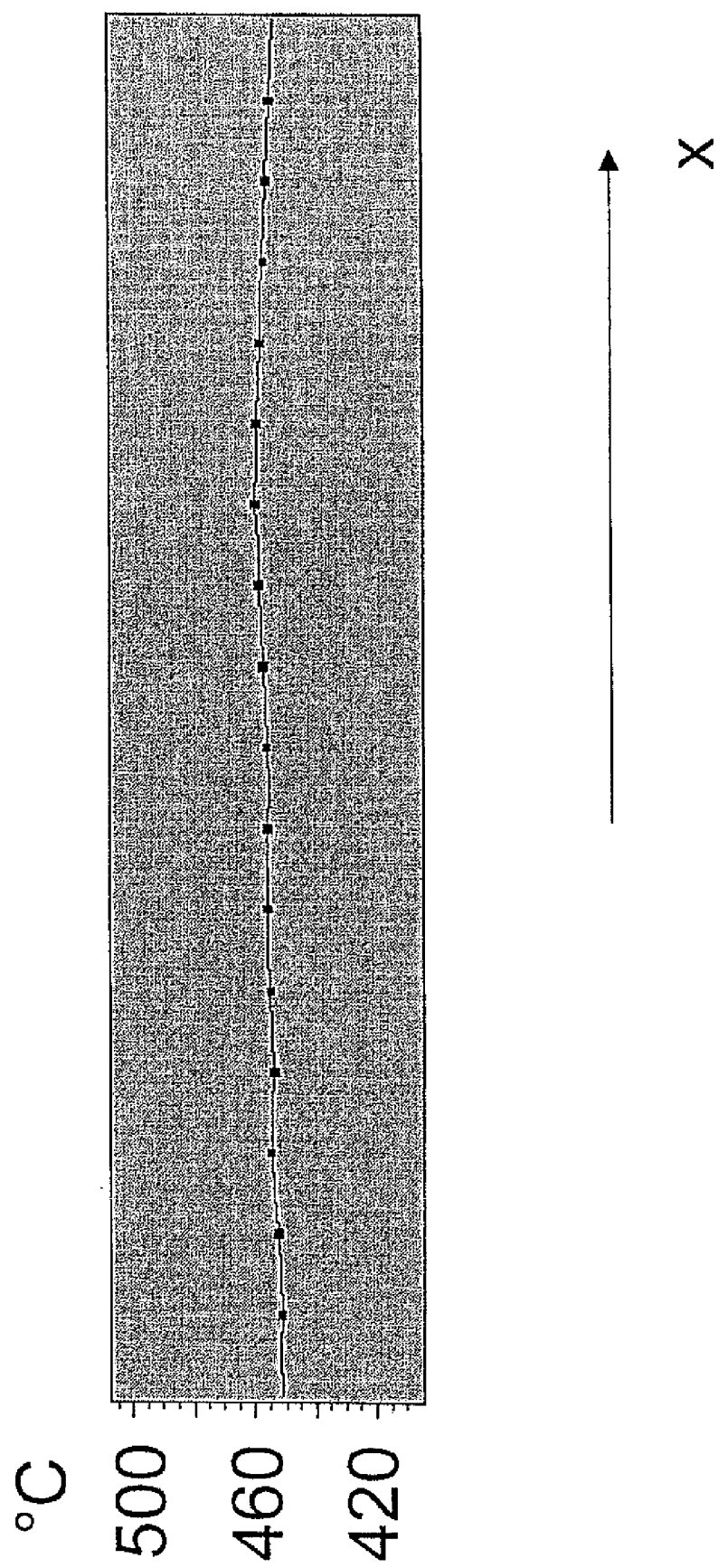
FIG. 5 a measured temperature profile over a juncture with the type of connection according to FIG. 4d.

As may be seen from FIG. 5, the temperature fluctuations in the connecting region or juncture are of an order of magnitude of less than approximately ±5° Celsius.

Exemplary Embodiment 2

To produce a multicrystalline silicon ingot, the interior of a melting crucible is filled with a lumpy or granular silicon feedstock. To remove unwanted atmospheric oxygen, the device according to FIG. 1 is rinsed with inert gas, for example argon. Following this, the melting of the silicon can commence under vacuum or even at normal pressure by positioning and powering up the upper heater, bottom heater and the jacket heater. After several hours a temperature above the melting temperature and less than 1550° C. is achieved and the melting is completed. The bottom heater is now reduced to a defined temperature of at least 10° C. below melting temperature. The initiation of the crystal growth now takes place on the bottom of the melting crucible. After a short time, an equilibrium temperature profile is established and the initiated crystal growth comes to a stop. In this condition, the upper heater and bottom heater have the desired temperature difference, which is equal to the temperature difference between the top and bottom end of the jacket heater. Now, one of the heaters is powered down and to be precise in parallel to the others. There is a columnar growth of a plurality of crystals. Corresponding to the horizontal phase interface, the growth takes place vertically from the bottom upward. The multicrystalline Si ingot obtained in this way is then cooled to room temperature and removed. In this way, a square-shaped Si ingot of 680×680 mm is obtained. The multicrystalline silicon ingot has a low crystal defect density over the entire crystal volume.

As is automatically evident to a person skilled in the art, the segmented meandering heater design can also be used for the heaters above and below the crucible. However, there is expediently no variation of the current-carrying sections since the top side and bottom side of the silicon ingot should be heated as homogeneously as possible. The optional heater provided under the base of the crucible assists the melting of lumpy silicon with the object of the shortest possible process time. However, in principle, the heater on the base of the crucible is not required during crystallisation.

A heater above the crucible also assists in reducing the process time for melting lumpy silicon when this takes place in the crucible. During crystallisation, the function of the heater above the crucible is, in conjunction with the jacket heater, to reduce the temperature level in the entire crucible so that the crystallisation always takes place on a planar phase interface and, to be precise, independently of the height in the crucible at which it takes place. The temperature reduction of the heaters is in this regard electronically controlled and occurs without any lowering of the crucible.

The heater design in conjunction with the electronically controlled temperature reduction achieves in particular the following advantages:

the planar phase interface in all crystallisation phases enables a columnar, vertical growth of the Si grains with a homogeneous structure;

low number of linear defects in the ingot, identifiable on the Si wafer from a lower density of etch pits;

minimisation of the convection flows in the still molten Si above the phase interface and thereby minimisation of the transport of $Si_3N_4$ particles from the internally coated quartz crucible wall into the interior of the melt or minimisation of the transport of SiC particles from the surface of the molten Si into the interior of the melt resulting in fewer occlusions in the ingot; the yield and the efficiency are improved by the aforementioned minimisation;

prevention of stresses in the corner area of the ingot and thereby avoidance of increased defect concentrations in the corners, avoidance of stress-induced micro-cracks which would otherwise result in yield losses in later processing steps.

LIST OF REFERENCE NUMBERS

1 Crystallisation system
2 Crucible
3 Melt
4 Graphite container
40 Crucible mounting plate
5 Bottom heater
6 Upper heater
7 Jacket heater
8 Thermal insulation
9 Temperature sensor
10 Horizontal web
100 First segment
101 Second segment
102 Interface
103 Central projection
104 Connecting element
11 Horizontal web
12 Horizontal web
13 Horizontal web
14a-c Gap
15 Vertical connecting web
16 Vertical connecting web
17 Vertical connecting web
18 Hole/recess
19 Recess
20 Recess
21 Edge

What is claimed is:

1. A method of making a monocrystalline or a multicrystalline material blank by a vertical-gradient-freeze method, said method comprising the steps of:

a) providing a fixed crucible having side faces and corner areas, said fixed crucible having a rectangular cross section with four corners, a top end and a bottom end, if viewed in a longitudinal direction extending from the bottom end to the top end;

b) providing a heating jacket disposed around the crucible, said heating jacket comprising a plurality of heating elements disposed on the side faces of the crucible, said heating elements having a meandering course in the longitudinal direction or perpendicular thereto;

c) melting material for the monocrystalline or the multicrystalline material blank in the fixed crucible;

d) forming a temperature gradient from the top end to the bottom end in the crucible to initiate crystal growth in the material melted in step c) starting from the bottom end of the crucible by means of a heating device;

e) suppressing heat flow perpendicular to the longitudinal direction of the crucible by a controlled heating of the heating jacket disposed around the crucible; and f) providing increased heat output of the heating elements at inversion zones of the meandering course at the corner areas of the rectangular cross section in comparison to heat output at other areas not at the corner areas of the rectangular cross section and/or decreasing a distance between a wall of the crucible and the heating elements at the inversion zones of the meandering course at the corner areas of the rectangular cross section.

2. The method according to claim 1, wherein the step f) comprises providing the increased heat output of the heating elements at the inversion zones of the meandering course at the corner areas of the rectangular cross section continuously or in at least one discrete step and/or providing the decreasing of the distance between the wall of the crucible and the heating elements at the inversion zones of the meandering course at the corner areas of the rectangular cross section in the at least one discrete step.

3. The method according to claim 2, wherein the step b) further comprises providing the webs as webs extending in the longitudinal direction, whose conductor cross sections increase continuously or in a plurality of discrete steps going from the top end to the bottom end, and providing the webs such that they extend equidistantly and parallel to each other.

4. The method according to claim 1, wherein the step b) comprises providing said heating elements as rectangular webs having a conductor cross section which is constricted at the inversion zones in a diagonal direction in such a way that it is equal to the conductor cross section of an associated web before or after the inversion zone.

5. The method according to claim 4, wherein the step b) further comprises forming the constrictions of the conductor cross section at the inversion zones by a plurality of perforations or recesses in or out of the web material formed in a transverse distribution relative to the conductor cross section.

6. The method according to claim 5, wherein the step b) further comprises aligning the perforations or recesses in the diagonal direction.

7. The method according to claim 5, wherein the step b) further comprises disposing the perforations or recesses mirror-symmetrically to a center line of a gap formed between two adjacent heating elements.

8. The method according to claim 4, wherein the step b) further comprises providing the webs as webs extending perpendicular to the longitudinal direction, whose conductor cross sections increase in discrete steps going from the top end to the bottom end, and providing the webs such that they extend equidistantly and parallel to each other.

9. The method according to claim 4, wherein the step b) further comprises providing the webs with a plurality of segments such that the segments are connected detachably to each other by means of connecting elements or that the segments are provided firmly bonded to each other.

10. The method according to claim 1, wherein the crucible and the heating jacket are provided such that a distance between a wall of the crucible and a plane spanned by the heating jacket is constant over an entire circumference of the crucible.

11. The method according to claim 1, wherein the step d) further comprises reducing a heat output of the heating jacket in the longitudinal direction according to the temperature gradient in a center of the crucible.

12. The method according to claim 1, wherein the step d) further comprises setting or maintaining a plurality of planar isotherms perpendicular to the longitudinal direction using a flat heating element.

13. The method according to claim 1, wherein the step d) further comprises reducing a heat output of the heating jacket forming a heating zone going from the top end to the bottom end, in order to at least contribute to the temperature gradient formed in the crucible.

14. The method according to claim 1, wherein the step a) further comprises providing said fixed crucible having a square-shaped cross section.

15. The method according to claim 14, wherein said multicrystalline material blank consists of a multicrystalline silicon.

* * * * *